(12) United States Patent
Sage et al.

(10) Patent No.: US 11,693,047 B2
(45) Date of Patent: Jul. 4, 2023

(54) CRYOGENIC WAFER TEST SYSTEM

(71) Applicants: Tessandra Anne Sage, Long Beach, NY (US); Stanley Katsuyoshi Wakamiya, Ellicott City, MD (US); Jonathan Francis Van Dyke, East Elmhurst, NY (US); Kevin Collao, Rosedale, MD (US); Joshua P. Osborne, Ellicott City, MD (US)

(72) Inventors: Tessandra Anne Sage, Long Beach, NY (US); Stanley Katsuyoshi Wakamiya, Ellicott City, MD (US); Jonathan Francis Van Dyke, East Elmhurst, NY (US); Kevin Collao, Rosedale, MD (US); Joshua P. Osborne, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 27 days.

(21) Appl. No.: 17/366,316

(22) Filed: Jul. 2, 2021

(65) Prior Publication Data

US 2023/0003788 A1 Jan. 5, 2023

(51) Int. Cl.
*G01R 31/28* (2006.01)
*G01R 1/073* (2006.01)

(52) U.S. Cl.
CPC ..... *G01R 31/2849* (2013.01); *G01R 1/07342* (2013.01)

(58) Field of Classification Search
CPC ............. G01R 31/2849; G01R 1/07342
See application file for complete search history.

(56) References Cited

U.S. PATENT DOCUMENTS

| 2004/0169521 A1* | 9/2004 | Rincon | G01R 1/07378 |
| | | | 324/756.03 |
| 2021/0025936 A1* | 1/2021 | Ohtaki | G01R 1/07342 |

FOREIGN PATENT DOCUMENTS

WO  WO-2021102181 A2 * 5/2021 ......... G01R 31/2877

* cited by examiner

*Primary Examiner* — Lee E Rodak
(74) *Attorney, Agent, or Firm* — Tarolli, Sundheim, Covell & Tummino LLP

(57) ABSTRACT

One example includes a cryogenic wafer test system. The system includes a first chamber that is cooled to a cryogenic temperature and a wafer chuck confined within the first chamber. The wafer chuck can be configured to accommodate a wafer device-under-test (DUT) comprising a plurality of superconducting die. The system also includes at least one wafer prober configured to implement a test on a superconducting die of the plurality of superconducting die via a plurality of electrical probe contacts. The system further includes a wafer chuck actuator system confined within a second chamber. The wafer chuck actuator system can be configured to provide at least one of translational and rotational motion of the wafer chuck to facilitate alignment and contact of a plurality of electrical contacts of the superconducting die to the respective plurality of electrical probe contacts of the at least one wafer prober.

12 Claims, 3 Drawing Sheets

CRYOGENIC WAFER TEST SYSTEM

TECHNICAL FIELD

This disclosure relates generally to classical and superconducting computing systems, and more specifically to a cryogenic wafer test system.

BACKGROUND

Fabrication of integrated circuits (ICs) fundamentally requires testing to determine if the electronic circuits operate as intended. Testing is typically performed at the die level on a given wafer device-under-test (DUT), prior to the many die on the wafer being cut and mounted in respective packages to form the associated "chips". Test systems are typically operated at an environment that simulates typical operation of the circuit to be tested on the respective wafer DUT. Thus, typical semiconductor-based ICs are tested at a non-cryogenic temperature (e.g., "room-temperature") to determine efficacy of the circuit. Similarly, typical superconducting circuits are tested at cryogenic temperatures. Such testing of superconducting circuits at cryogenic temperatures can be both expensive and labor-intensive. For example, for a typical superconducting die test, the wafer DUT is diced into individual chips, placed into special fixtures, and dipped into a liquid helium Dewar, which can be time consuming and helium intensive, and thus not scalable for high volume throughput.

SUMMARY

One example includes a cryogenic wafer test system. The system includes a first chamber that is cooled to a cryogenic temperature and a wafer chuck confined within the first chamber. The wafer chuck can be configured to accommodate a wafer device-under-test (DUT) comprising a plurality of superconducting die. The system also includes at least one wafer prober configured to implement a test on a superconducting die of the plurality of superconducting die via a plurality of electrical probe contacts. The system further includes a wafer chuck actuator system confined within a second chamber. The wafer chuck actuator system can be configured to provide at least one of translational and rotational motion of the wafer chuck to facilitate alignment and contact of a plurality of electrical contacts of the superconducting die to the respective plurality of electrical probe contacts of the at least one wafer prober.

Another example includes a method for testing a plurality of superconducting die on a wafer device-under-test (DUT) via a cryogenic wafer test system. The method includes securing the wafer DUT on a wafer chuck in a first chamber of the cryogenic wafer test system. The method also includes cooling the first chamber to a cryogenic temperature. The method further also facilitating at least one of translational and rotational motion of the wafer chuck via a wafer chuck actuator system confined within a second chamber of the cryogenic wafer test system to facilitate alignment and contact of a plurality of electrical contacts of a superconducting die of the plurality of superconducting die to a respective plurality of electrical probe contacts of at least one wafer prober that is confined within the first chamber. The method further includes implementing a test of the respective superconducting die via the at least one wafer prober.

Another example includes a cryogenic wafer test system. The system includes a first chamber that is cooled to a cryogenic temperature in a vacuum and a wafer chuck confined within the first chamber. The wafer chuck can be configured to accommodate a wafer device-under-test (DUT) comprising a plurality of superconducting die. The system also includes at least one wafer prober configured to implement a test on a superconducting die of the plurality of superconducting die via a plurality of electrical probe contacts. The system further includes a wafer chuck actuator system confined within a second chamber in a vacuum at a non-cryogenic temperature. The wafer chuck actuator system can be configured to provide translational and rotational motion of the wafer chuck to facilitate alignment and contact of a plurality of electrical contacts of the superconducting die to the respective plurality of electrical probe contacts of the at least one wafer prober.

DETAILED DESCRIPTION

Figure 1:
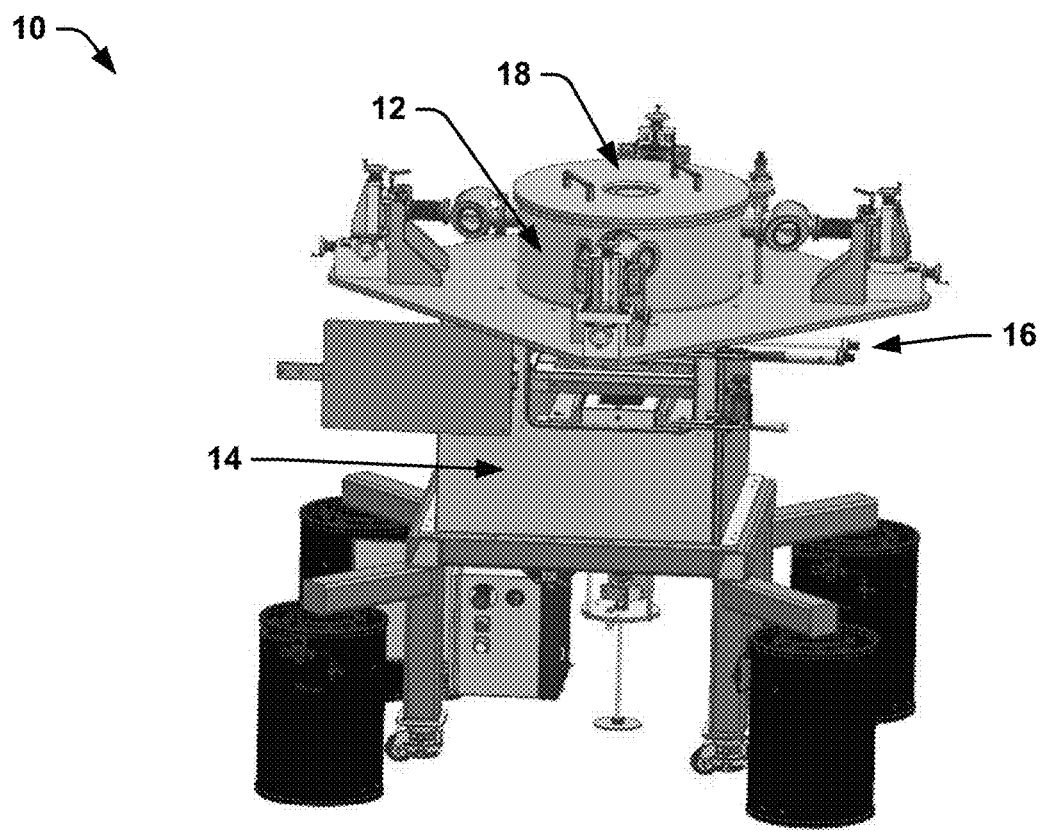
FIG. 1 illustrates an example of a cryogenic wafer test system.

This disclosure relates generally to classical and superconducting computing systems, and more specifically to a cryogenic wafer test system. The cryogenic wafer test system includes a first chamber that is cooled to a cryogenic temperature in a vacuum. The first chamber includes a wafer chuck configured to accommodate a wafer device-under-test (DUT) comprising a plurality of superconducting die. The cryogenic wafer test system also includes at least one wafer prober arranged in the first chamber. The wafer prober(s) includes electrical probe contacts that are implemented to provide physical contact to electrical contacts of a superconducting die of the plurality of superconducting die to implement a test of the superconducting die. As described herein, the terms "electrical contacts" and "electrical probe contacts" correspond to electrical conductor or superconductor contact surfaces on the superconducting die and the wafer prober(s), respectively, that are configured to provide electrical impulses between them for implementing a test. For example, a first portion of the electrical probe contacts can provide electrical impulses (e.g., single flux quantum (SFQ) pulses or reciprocal quantum logic (RQL) pulses) as inputs to the superconducting die via a respective first portion of the electrical contacts, such that the superconducting die can output responsive electrical impulses via a second portion of the electrical contacts to a respective second portion of the electrical probe contacts.

The cryogenic wafer test system also includes a second chamber, such as separated from the first chamber by a radiation barrier. The second chamber can likewise be evacuated, and can be held at a non-cryogenic temperature. The second chamber includes a wafer chuck actuator system configured to provide at least one of translational and rotational motion of the wafer chuck to facilitate alignment and contact of a plurality of electrical contacts of the superconducting die to the respective plurality of electrical probe contacts of the at least one wafer prober.

As described herein, the terms "first chamber" and "second chamber" can refer to two separate portions of a same chamber (e.g., "upper chamber portion" and "lower chamber portion", respectively) that are separated by the radiation barrier, as described in greater detail herein. As also described herein, the term "cryogenic" describes a temperature that is equal to or less than approximately 5 Kelvin, and the term "non-cryogenic" describes a temperature that is greater than the cryogenic temperature.

For example, the wafer prober(s) can be configured as one of a probe card or a plurality of prober arms. For example, the probe card can be arranged in a fixed location in the first chamber, such that the wafer chuck is manipulated via the wafer chuck actuator system to align and contact the electrical contacts of the superconducting die to the electrical contacts of the probe card. As an example, the probe card includes a through-hole to facilitate alignment (e.g., via a vision system) to the superconducting die. As another example, the prober arms can be arranged to have a wedge-shaped distal end on which the electrical contacts can be arranged on a surface to provide contact with the electrical contacts of the superconducting die. For example, each of the prober arms can be separately and independently articulated to facilitate alignment and contact of the electrical contacts of the respective prober arms with the electrical contacts of the superconducting die.

FIG. 1 illustrates an example of a cryogenic wafer test system 10. The cryogenic wafer test system 10 can be configured substantially the same as the cryogenic wafer test system described in Ser. No. 17/366,337, which is incorporated in its entirety herein by reference. The cryogenic wafer test system 10 can be configured to perform testing of each of a plurality of superconducting die on a wafer DUT. For example, the wafer DUT can have a minimum diameter of approximately fifteen centimeters, and can include several hundred separate die (e.g., with each die being sized at approximately five mm$^2$) to be tested. In the example of FIG. 1, the cryogenic wafer test system 10 includes a first chamber 12 and a second chamber 14, with the second chamber 14 being located beneath the first chamber 12. For example, the first and second chambers 12 and 14 can be separated by a radiation barrier that is configured to provide a thermal gradient between the first and second chambers 12 and 14. Therefore, the first chamber 12 can be held to a cryogenic temperature to test the superconducting die and the second chamber 14 can be held to a non-cryogenic temperature. For example, the first chamber 12 can be coupled to liquid (e.g., helium) coolant lines 16 to bring the temperature of the first chamber 12 down to the cryogenic temperature (e.g., approximately 5 K or lower). As an example, the first and second chambers 12 and 14 can both be evacuated, and the radiation barrier can facilitate mechanical interface between the first and second chambers 12 and 14.

Figure 2:
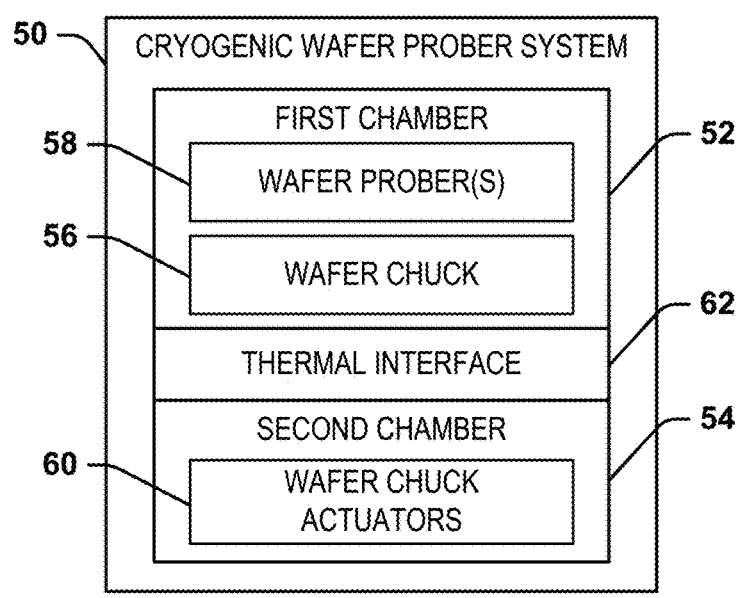
FIG. 2 illustrates an example diagram of a cryogenic wafer test system.

FIG. 2 illustrates an example diagram of a cryogenic wafer test system 50. The cryogenic wafer test system 50 can correspond to the cryogenic wafer test system 10 in the example of FIG. 1. Therefore, reference is to be made to the example of FIG. 1 in the following description of the example of FIG. 2.

The cryogenic wafer test system 50 includes a first chamber 52 and a second chamber 54 that can correspond, respectively, to the first and second chambers 12 and 14 in the example of FIG. 1. As an example, the first and second chambers 52 and 54 can both be evacuated, and the first chamber 52 is cooled to a cryogenic temperature. The first chamber 52 includes a wafer chuck 56 configured to accommodate a wafer DUT comprising a plurality of superconducting die to be tested. The cryogenic wafer test system 50 also includes at least one wafer prober 58 arranged in the first chamber 52. The wafer prober(s) 58 includes electrical probe contacts that are implemented to provide physical contact to electrical contacts of a superconducting die of the plurality of superconducting die to implement a test of the superconducting die.

The second chamber 54 includes a wafer chuck actuator system 60 configured to provide at least one of translational and rotational motion of the wafer chuck 56. Therefore, the wafer chuck 56 can be manipulated to facilitate alignment and contact of the plurality of electrical contacts of the superconducting die to the respective plurality of electrical probe contacts of the wafer prober(s) 58. The translational motion can include motion of the wafer chuck 56 along three orthogonal axes, and the rotational motion can provide rotation of the wafer chuck 56 about an axis perpendicular to a planar surface of the wafer DUT. Therefore, the wafer chuck actuator system 60 is configured to facilitate motion of the wafer DUT to align the electrical contacts of a given one of the superconducting die to the electrical probe contacts of the wafer prober(s) 58. Thus, the wafer chuck actuator system 60 can provide precision contact of the electrical contacts of the respective one of the superconducting die to the electrical probe contacts of the wafer prober(s) 58 to facilitate the test of the respective one of the superconducting die.

Referring back to the example of FIG. 1, the first chamber 12 can include a substantially transparent viewing window 18 that can provide an overhead view to the inside the first chamber 12. Therefore, the viewing window 18 can provide a view of the planar surface of the wafer DUT to facilitate the alignment of the wafer DUT to the wafer prober(s) 58, and thus the electrical contacts of the wafer DUT to the respective electrical prober contacts of the wafer prober(s) 58, via the wafer chuck actuator system 60. As an example, the viewing window can be formed of any of a variety of substantially transparent crystalline materials that can facilitate operation in the first chamber 12 at the cryogenic temperature. As another example, the cryogenic wafer test system 10 can include an electronic vision system (not shown) that can provide approximately real-time imaging of the first chamber 12 through the viewing window 18. Accordingly, the vision system can further facilitate alignment of the electrical contacts on the surface of the superconducting die to the respective electrical probe contacts on the wafer prober(s) 58 to allow for real-time adjustments of the position of the wafer DUT via the wafer chuck actuator system 60 for aligning the electrical contacts to the electrical probe contacts.

Referring back to the example of FIG. 2, the second chamber 54 is demonstrated as separated from the first chamber 52 by a radiation barrier 62. As described herein, the radiation barrier 62 is configured to provide a thermal gradient between the first and second chambers 52 and 54 by occluding direct line radiation from propagating from the second chamber 54 to the first chamber 52. For example, because both the first and second chambers 52 and 54 can be evacuated, there is substantially no convection heat transfer that can occur from the second chamber 54 to the first chamber 52. Thus, only radiation can provide heat transfer from the second chamber 54 to the first chamber 52. As a result, by occluding direct line radiation from propagating from the second chamber 54 to the first chamber 52, the radiation barrier 62 can substantially mitigate heat transfer from the second chamber 54 to the first chamber 52. Therefore, the first chamber 52 can be held to a cryogenic temperature (e.g., approximately 5 K or lower) to test the superconducting die and the second chamber 54 can be held to a non-cryogenic temperature. As an example, the first and second chambers 12 and 14 can both be evacuated, and the radiation barrier 62 can facilitate mechanical interface between the first and second chambers 52 and 54. Therefore, the wafer chuck actuator system 60 can be mechanically coupled to the wafer chuck 56 through the radiation barrier 62 to facilitate the translational and/or rotational motion of the wafer chuck 56 via the wafer chuck actuator system 60 through the radiation barrier 62.

The arrangement of the cryogenic wafer test system 50 can thus facilitate a more efficient testing environment of superconducting die than typical superconducting test fixtures. For example, by facilitating motion of the wafer chuck 56, and thus the wafer DUT, via the wafer chuck actuator system 60, the cryogenic wafer test system 50 can test multiple superconducting die sequentially in an indexed manner on the wafer DUT, as opposed to testing individually cut superconducting die that have been individually cooled via dipping into a liquid Dewar. As a result, by performing tests iteratively on each of the superconducting die on the wafer DUT, the process of testing each of the superconducting die in an indexed manner can be significantly more efficient by saving time between testing of each individual superconducting die, as well as by saving energy and cooling material (e.g., liquid helium) by operating the first chamber 52 that encapsulates the wafer DUT at the cryogenic temperature. Accordingly, the cryogenic wafer test system 50 provides for much more efficient testing than typical systems that implement superconducting die testing.

Figure 3:
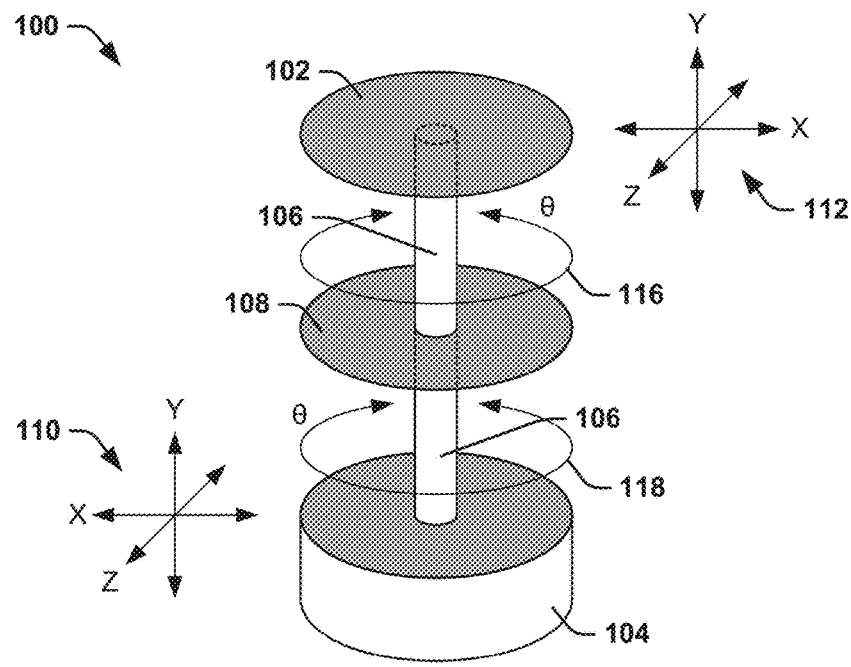
FIG. 3 illustrates an example diagram of motion of the wafer chuck.

FIG. 3 illustrates an example diagram 100 of motion of a wafer chuck. The diagram 100 can correspond to demonstration of motion of a wafer chuck 102 via a wafer chuck actuator system 104. As an example, the wafer chuck 102 can correspond to the wafer chuck 56 in the example of FIG. 2, and the wafer chuck actuator system 104 can correspond to the wafer chuck actuator system 60 in the example of FIG. 2. Therefore, reference is to be made to the example of FIG. 2 in the following description of the example of FIG. 3.

In the example of FIG. 3, the wafer chuck 102 and the wafer chuck actuator system 104 are demonstrated as coupled via a mechanical linkage 106 that extends from the wafer chuck actuator system 104 through a radiation barrier 108 to the wafer chuck 102. As an example, the mechanical linkage 106 can correspond to any of a variety of mechanical and physical connections between the wafer chuck 102 and the wafer actuator system 104. For example, the mechanical linkage 106 can be configured as a cylindrical or prismatic shaft extending between the wafer chuck actuator system 104 and the wafer chuck 102 to provide motion of the wafer chuck 102 in response to motion of or electrical commands from the wafer chuck actuator system 104. As another example, the mechanical linkage 106 can include other or additional mechanical components, such as including gears, motors, servos, or a variety of other mechanical connection means.

In the example of FIG. 3, the wafer chuck actuator system 104 can perform translational motion or provide control commands to the wafer chuck 102 for translational motion, demonstrated at 110 as motion along three orthogonal axes (e.g., X, Y, and Z-axes). In response to the translational motion of or the control commands provided from the wafer chuck actuator system 104, the wafer chuck 102 can perform corresponding translational motion along the respective three orthogonal axes (e.g., the corresponding X, Y, and Z-axes), demonstrated at 112, via the mechanical linkage 106. Similarly, the wafer chuck actuator system 104 can perform rotational motion or provide control commands to the wafer chuck 102 for rotational motion, demonstrated as the circular arrow at 114 (e.g., about an angle θ). In response to the rotational motion of or the control commands provided from the wafer chuck actuator system 104, the wafer chuck 102 can perform corresponding rotational motion about an axis perpendicular to a surface of the wafer chuck 102 (e.g., about an axis of the mechanical linkage 106), demonstrated at 116 (e.g., about the corresponding angle θ), via the mechanical linkage 106.

As a result, the wafer chuck actuator system 104 can be implemented by a user of the cryogenic wafer test system 50 to provide translational and/or rotational motion of the wafer chuck 102, and thus the wafer DUT that is affixed to the wafer chuck 102 during testing of the superconducting die on the wafer DUT. Therefore, each of the superconducting die on the wafer DUT can be individually tested by moving the wafer DUT (e.g., translationally and/or rotationally) to align the electrical contacts of each of the superconducting die to the electrical probe contacts of the wafer prober(s) 58 in an indexed sequence. As a result, the cryogenic wafer test system 50 can implement significantly more efficient testing of a plurality of superconducting die by testing the superconducting die on the wafer DUT, as opposed to testing individual superconducting die having been cut from a wafer and dipped into a liquid Dewar.

Figure 4:
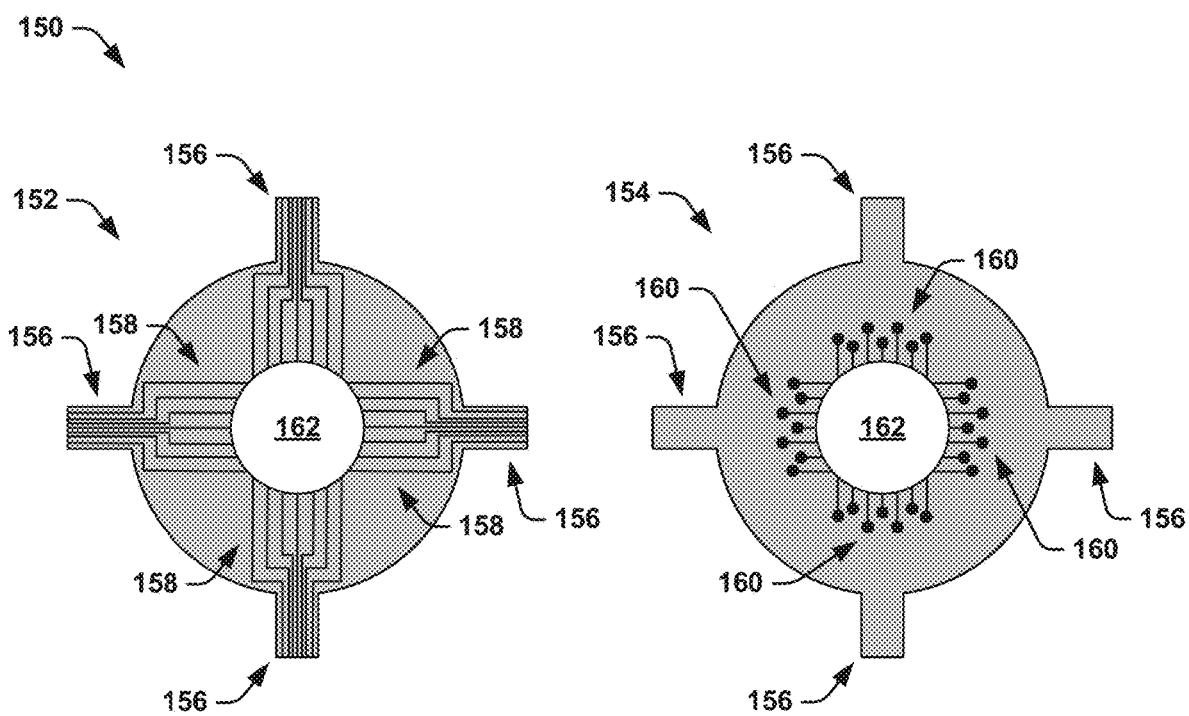
FIG. 4 illustrates an example of a probe card.

As described previously, the wafer prober(s) 58 can be configured as a probe card or a plurality of prober arms. FIG. 4 illustrates an example of a probe card 150. The probe card 150 is demonstrated in a first view 152 corresponding to a first surface (e.g., a "top" surface) and a second view 154 corresponding to a second surface (e.g., a "bottom" surface). The probe card 150 can be mounted in a fixed manner within the first chamber 52, such as at each of a set of extensions 156 that can extend to inner walls of the first chamber 52 for mechanical fastening. In the example of FIG. 4, the extensions 156 can also provide a conduit for electrical (e.g., conductor or superconductor) lines, demonstrated at 158, that can interconnect test circuitry (not shown), such as outside of the first chamber (e.g., via an interface), to provide and receive electrical impulses (e.g., SFQ or RQL pulses).

In the example of FIG. 4, the electrical lines 158 are demonstrated as terminating at a respective plurality of electrical probe contacts 160, with each of the electrical lines 158 and the electrical probe contacts 160 being electrically isolated with respect to each other. The electrical probe contacts 160 are located on the second surface of the probe card 150, such that the electrical probe contacts 160 on the surface of the probe card 150 can contact corresponding electrical contacts of the superconducting die of the wafer DUT. In the example of FIG. 4, the electrical lines 158 are demonstrated as extending inward from each of the sets of extensions 156 on the first surface toward a through-hole 162, such that the electrical lines 158 extend through the through-hole 162 and from the through-hole 162 to the electrical probe contacts 160. As an example, the through-hole 162 can facilitate alignment of the electrical probe contacts 160 with the electrical contacts of the respective superconducting die of the wafer DUT (e.g., via the vision system described previously). For example, each of the superconducting die on the wafer DUT can include keying features that can be visible through the through-hole 162

(e.g., via the vision system) to facilitate alignment of the electrical probe contacts 160 with the electrical contacts of the respective superconducting die of the wafer DUT via the wafer chuck actuator system 60.

It is to be understood that the arrangement of the probe card 150 is not limited to the example of FIG. 4, and that the relative size and spacing of the electrical lines 158 and the electrical probe contacts 160 are demonstrated in an exaggerated (e.g., not-to-scale) manner. For example, the probe card 150 is not limited to the electrical lines 158 being disposed on the surfaces of the probe card 150, but can instead be embedded therein, and/or can extend from the first surface to the second surface by way of electrical vias. As another example, the physical arrangement of the probe card 150 is not limited to being approximately circular with four extensions 156 and a circular through-hole 162, but that other physical arrangements of the probe card 150 are possible. Accordingly, the probe card 150 can be arranged in any of a variety of ways.

Figure 5:
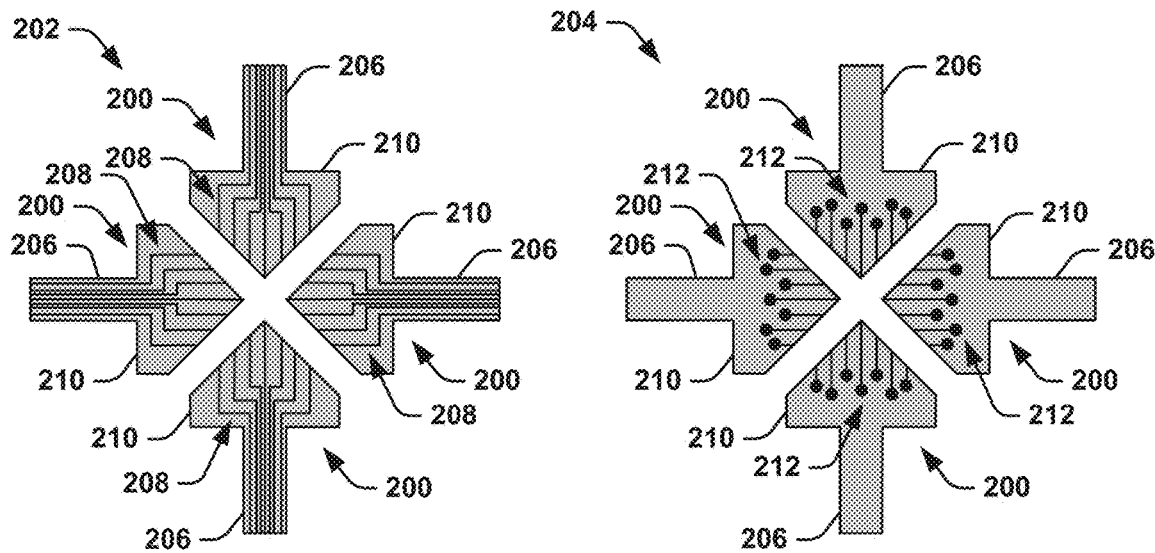
FIG. 5 illustrates an example of prober arms.

FIG. 5 illustrates an example of a plurality of prober arms 200. The prober arms 200 are demonstrated in a first view 202 corresponding to respective first surfaces (e.g., "top" surfaces) and a second view 204 corresponding to respective second surfaces (e.g., "bottom" surfaces). Each of the prober arms 200 can be mounted within the first chamber 52, such as via extensions 206 that can each extend to inner walls of the first chamber 52 for mechanical fastening. As an example, the extensions 206 can each be articulating to provide for motion of each of the prober arms 200 separately and independently with respect to each other. In the example of FIG. 5, the extensions 206 can also provide a conduit for electrical (e.g., conductor or superconductor) lines, demonstrated at 208, that can interconnect test circuitry (not shown), such as outside of the first chamber 52 (e.g., via an interface), to provide and receive electrical impulses (e.g., SFQ or RQL pulses). Each of the prober arms 200 also includes a wedge-shaped distal probe portion 210.

In the example of FIG. 5, the electrical lines 208 on each of the prober arms 200 are demonstrated as terminating at a respective plurality of electrical probe contacts 212 on each of the wedge-shaped distal probe portions 210, with each of the electrical lines 208 and the electrical probe contacts 212 being electrically isolated with respect to each other. The electrical probe contacts 212 are located on the second surface of the wedge-shaped distal probe portions 210 of the prober arms 200, such that the electrical probe contacts 210 on the surface of the prober arms 200 can contact corresponding electrical contacts of the superconducting die of the wafer DUT. In the example of FIG. 5, the electrical lines 208 are demonstrated as along each of the respective prober arms 200 from the proximal portions of the extensions 206 on the first surface toward the wedge-shaped distal portions 210, such that the electrical lines 208 extend around a periphery of the wedge-shaped distal portions 210 to the electrical probe contacts 212 on the second surface.

For example, based on the wedge-shape of each of the wedge-shaped distal probe portions 210, the electrical probe contacts 212 of the prober arms 200 can be substantially proximally situated. Therefore, the prober arms 200 are collectively configured to provide contact of the electrical probe contacts 212 with the electrical contacts on the surface of the superconducting die. However, because the prober arms 200 can be separately and independently articulated via the extensions 206, the prober arms 200 can be moved independently to facilitate alignment of the electrical probe contacts 212 with the electrical contacts of the respective superconducting die of the wafer DUT (e.g., via the vision system described previously). Therefore, after an approximate alignment of the electrical probe contacts 212 with the electrical contacts of the respective superconducting die of the wafer DUT via the wafer chuck actuator system 60, the position of the prober arms 200 can be refined to provide for more precise alignment of the electrical probe contacts 212 with the electrical contacts of the respective superconducting die of the wafer DUT, such as to mitigate alignment errors that can result from thermal effects or fabrication mismatches of the superconducting die on the wafer DUT.

It is to be understood that the arrangement of the prober arms 200 is not limited to the example of FIG. 5, and that the relative size and spacing of the electrical lines 208 and the electrical probe contacts 212 are demonstrated in an exaggerated (e.g., not-to-scale) manner. For example, the prober arms 200 are not limited to the electrical lines 208 being disposed on the surfaces of the prober arms 200, but can instead be embedded therein, and/or can extend from the first surface to the second surface by way of electrical vias. As another example, the physical arrangement of the prober arms 200 are not limited to four prober arms 200, but that other physical arrangements of the prober arms 200 are possible. Accordingly, the prober arms 200 can be arranged in any of a variety of ways.

Figure 6:
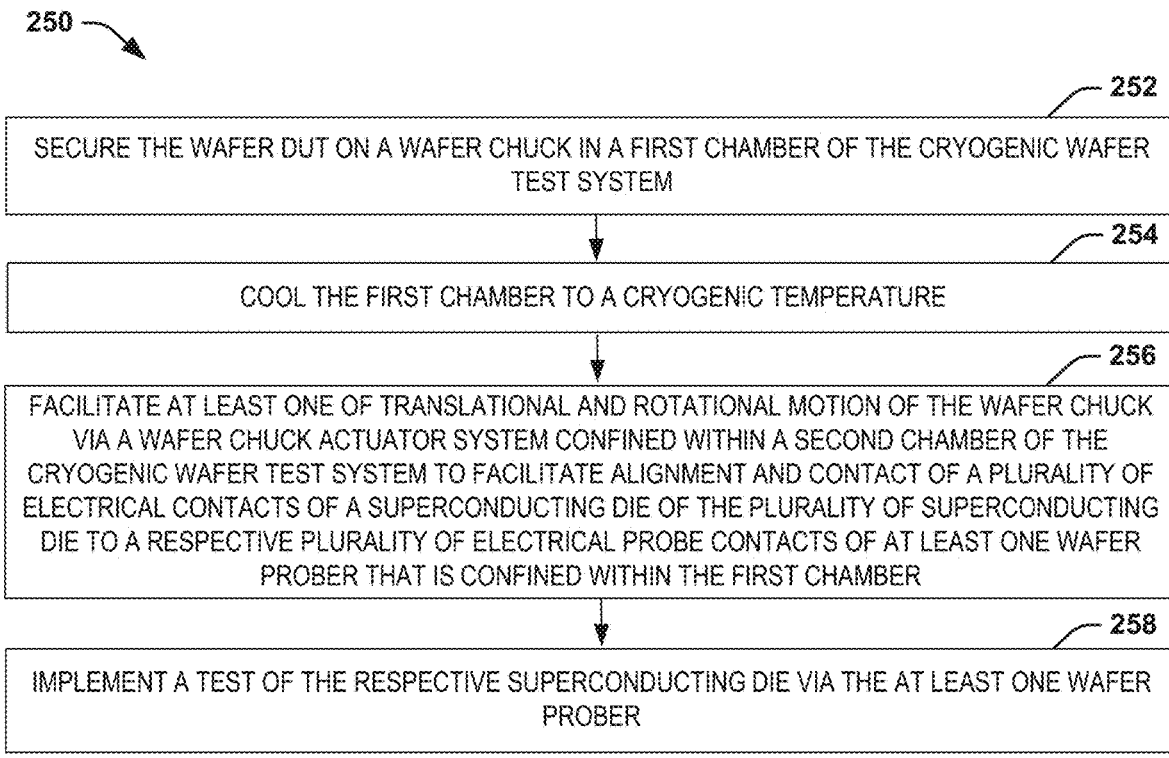
FIG. 6 illustrates an example of a method for testing a plurality of superconducting die on a wafer device-under-test (DUT) via a cryogenic wafer test system.

In view of the foregoing structural and functional features described above, a methodology in accordance with various aspects of the disclosure will be better appreciated with reference to FIG. 6. FIG. 6 illustrates an example of a method 250 for testing a plurality of superconducting die on a wafer device-under-test (DUT) via a cryogenic wafer test system (e.g., the cryogenic wafer test system 10. It is to be understood and appreciated that the method of FIG. 6 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 252, the wafer DUT is secured on a wafer chuck (e.g., the wafer chuck 56) in a first chamber (e.g., the first chamber 52) of the cryogenic wafer test system. At 254, the first chamber is cooled to a cryogenic temperature. At 256, at least one of translational and rotational motion of the wafer chuck is facilitated via a wafer chuck actuator system (e.g., the wafer chuck actuator system 60) confined within a second chamber (e.g., the second chamber 54) of the cryogenic wafer test system to facilitate alignment and contact of a plurality of electrical contacts of a superconducting die of the plurality of superconducting die to a respective plurality of electrical probe contacts (e.g., the electrical probe contacts 158 or 212) of at least one wafer prober (e.g., the wafer prober(s) 58) that is confined within the first chamber. At 258, a test of the respective superconducting die is implemented via the at least one wafer prober.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A cryogenic wafer test system comprising:
a first chamber that is cooled to a cryogenic temperature;
a wafer chuck confined within the first chamber, the wafer chuck being configured to accommodate a wafer device-under-test (DUT) comprising a plurality of superconducting die;
a probe card configured to implement a test on a superconducting die of the plurality of superconducting die via a plurality of electrical probe contacts, the probe card including at least one through-hole that extends from a first surface to an opposite second surface to facilitate alignment of a plurality of electrical contacts on a surface of the superconducting die to a respective plurality of electrical probe contacts on the opposing second surface of the probe card, the probe card including a plurality of electrical lines that extend from the first surface through the at lease one through-hole and connect to the respective plurality of electrical probe contacts on the second surface of the probe card; and
a wafer chuck actuator system confined within a second chamber, the wafer chuck actuator system being configured to provide at least one of translational and rotational motion of the wafer chuck to facilitate alignment and contact of the plurality of electrical contacts of the superconducting die to the respective plurality of electrical probe contacts of the probe card.

2. The system of claim 1, wherein each of the first and second chambers are vacuum sealed.

3. The system of claim 1, wherein the wafer chuck actuator system is configured to provide translational motion of the wafer chuck along each of three orthogonal axes, and is further configured to rotate the wafer chuck about an axis perpendicular to a planar surface of the superconducting wafer DUT.

4. The system of claim 1, wherein the second chamber is operated at a non-cryogenic temperature.

5. The system of claim 4, further comprising a radiation barrier interconnecting the first chamber and the second chamber, the radiation barrier being configured to provide a thermal gradient between the first chamber and the second chamber.

6. The system of claim 1, wherein the probe card includes the plurality of electrical contacts on the second surface, the probe card being mounted in the first chamber in a fixed manner such that the wafer chuck actuator system is configured to provide the at least one of translational and rotational motion of the wafer chuck to facilitate alignment and contact of the plurality of electrical contacts on the surface of the superconducting die to the respective plurality of electrical probe contacts on the opposing second surface of the probe card.

7. The system of claim 1, wherein the first chamber comprises a substantially transparent viewing window, the system further comprising a vision system configured to facilitate alignment of the plurality of electrical contacts on the surface of the superconducting die to the respective plurality of electrical probe contacts on the opposing second surface of the probe card.

8. A method for testing a plurality of superconducting die on a wafer device-under-test (DUT) via a cryogenic wafer test system, the method comprising:
securing the wafer DUT on a wafer chuck in a first chamber of the cryogenic wafer test system;
cooling the first chamber to a cryogenic temperature;
facilitating at least one of translational and rotational motion of the wafer chuck via a wafer chuck actuator system confined within a second chamber of the cryogenic wafer test system to facilitate alignment and contact of a plurality of electrical contacts of a superconducting die of the plurality of superconducting die to a respective plurality of electrical probe contacts of a plurality of prober arms that are confined within the first chamber, the plurality of prober arms including a wedge-shaped distal probe portion having electrical lines extending from a first surface around a periphery of the wedge-shape distal portion to the plurality of electrical probe contacts on a second surface, the first surface and the second surface being opposing surfaces of the plurality of prober arms; and
implementing a test of the respective superconducting die via the plurality of prober arms.

9. The method of claim 8, wherein each of the plurality of prober arms is configured to be articulating separately and independently of each other, the method further comprising aligning the plurality of electrical contacts of the superconducting die to the respective plurality of electrical probe contacts of the plurality of prober arms via the articulation of the plurality of prober arms.

10. A cryogenic wafer test system comprising:
a first chamber that is cooled to a cryogenic temperature in a vacuum;
a wafer chuck confined within the first chamber, the wafer chuck being configured to accommodate a wafer device-under-test (DUT) comprising a plurality of superconducting die;
a plurality of prober arms configured to implement a test on a superconducting die of the plurality of superconducting die via a plurality of electrical probe contacts, the plurality of prober arms including a wedge-shaped distal probe portion having a plurality of electrical lines extending from a first surface around a periphery of the wedge-shape distal portion to a plurality of electrical probe contacts on a second surface, the first surface and the second surface being opposing surfaces of the plurality of prober arms; and
a wafer chuck actuator system confined within a second chamber in a vacuum at a non-cryogenic temperature, the wafer chuck actuator system being configured to provide translational and rotational motion of the wafer chuck to facilitate alignment and contact of a plurality of electrical contacts of the superconducting die to the respective plurality of electrical probe contacts on each of the plurality of prober arms.

11. The system of claim 10, wherein each of the plurality of prober arms is configured to be articulating separately and independently of each other, such that the wedge-shaped distal probe portion of the plurality of prober arms is configured to collectively provide contact of the plurality of electrical contacts on the surface of the superconducting die to the respective plurality of electrical probe contacts on the second surface of each of the plurality of prober arms.

12. A method for testing a plurality of superconducting die on a wafer device-under-test (DUT) via a cryogenic wafer test system, the method comprising:
securing the wafer DUT on a wafer chuck in a first chamber of the cryogenic wafer test system;
cooling the first chamber to a cryogenic temperature;

facilitating at least one of translational and rotational motion of the wafer chuck via a wafer chuck actuator system confined within a second chamber of the cryogenic wafer test system to facilitate alignment and contact of a plurality of electrical contacts of a superconducting die of the plurality of superconducting die to a respective plurality of electrical probe contacts of a probe card that is confined within the first chamber, the probe card including at least one through-hole that extends from a first surface to an opposite second surface to facilitate alignment of the plurality of electrical contacts on of the superconducting die to the respective plurality of electrical probe contacts on the opposing second surface of the probe card, the probe card including a plurality of electrical lines that extend from the first surface through the at least one through-hole and connect the respective plurality of electrical probe contacts on the second surface of the probe card; and implementing a test of the respective superconducting die via the probe card.

\* \* \* \* \*